(12) United States Patent
Hayashi

(10) Patent No.: US 8,802,996 B2
(45) Date of Patent: Aug. 12, 2014

(54) WIRING BOARD AND MOUNTING STRUCTURE THEREOF

(75) Inventor: Katsura Hayashi, Kirishima (JP)

(73) Assignee: Kyocera Corporation, Kyoto-Shi, Kyoto (JP)

(*) Notice: Subject to any disclaimer, the term of this patent is extended or adjusted under 35 U.S.C. 154(b) by 0 days.

(21) Appl. No.: 13/819,080

(22) PCT Filed: Aug. 25, 2011

(86) PCT No.: PCT/JP2011/069137
§ 371 (c)(1),
(2), (4) Date: Feb. 26, 2013

(87) PCT Pub. No.: WO2012/029622
PCT Pub. Date: Mar. 8, 2012

(65) Prior Publication Data
US 2013/0153279 A1    Jun. 20, 2013

(30) Foreign Application Priority Data
Aug. 31, 2010    (JP) .................... 2010-193188

(51) Int. Cl.
*H05K 1/11*    (2006.01)
(52) U.S. Cl.
USPC ............ 174/255; 174/261; 174/262; 174/264

(58) Field of Classification Search
USPC .......... 174/255, 256, 260–264; 361/748, 760, 361/771
See application file for complete search history.

(56) References Cited

U.S. PATENT DOCUMENTS

| 8,129,623 B2 * | 3/2012 | Nagasawa et al. ............ 174/255 |
| 2011/0139494 A1 * | 6/2011 | Yu et al. ........................ 174/255 |

FOREIGN PATENT DOCUMENTS

| JP | 02253941 | 10/1990 |
| JP | 2006285226 | 10/2006 |
| JP | 2009158599 | 7/2009 |
| JP | 2009158599 A * | 7/2009 |

\* cited by examiner

*Primary Examiner* — Timothy Thompson
*Assistant Examiner* — Amol Patel
(74) *Attorney, Agent, or Firm* — Volpe and Koenig, P.C.

(57) ABSTRACT

A wiring board according to an embodiment includes an inorganic insulating layer provided with a via-hole which is a penetrating hole, and a via-conductor which is a penetrating conductor disposed inside the via-hole. The inorganic insulating layer includes first inorganic insulating particles connected to each other and second inorganic insulating particles that are larger in particle size than the first inorganic insulating particles and are connected to each other via the first inorganic insulating particles, and also has, at an inner wall of the via-hole V, a protrusion including at least part of the second inorganic insulating particle. The protrusion is covered with the via-conductor.

9 Claims, 8 Drawing Sheets

(a)

(b)

(a)

(b)

(a)

(b)

(c)

(d)

(a)

(b)

(c)

(a)

(b)

(a)

(b)

(a)

(b)

WIRING BOARD AND MOUNTING STRUCTURE THEREOF

FIELD OF INVENTION

The present invention relates to a wiring board and a mounting structure thereof used for electronic equipment (for example, audio visual equipment of various types, household electrical appliances, communications equipment, computer equipment, and peripherals thereof) and so forth.

BACKGROUND

As conventional mounting structures for electronic equipment, those of the type which is constructed by mounting an electronic component on a wiring board have been used. For example, in Japanese Unexamined Patent Publication JP-A 2-253941 (1990), there is disclosed a wiring board having a ceramic layer.

In this regard, when a penetrating conductor connected to wiring is formed in the ceramic layer, when the wiring board is subjected to heat, due to the difference in thermal expansion coefficient between the ceramic layer and the penetrating conductor, a thermal stress is applied in between the ceramic layer and the penetrating conductor, wherefore the ceramic layer and the penetrating conductor are likely to separate from each other. As the result of the separation of the ceramic layer and the penetrating conductor, the thermal stress applied in between the ceramic layer and the penetrating conductor tends to be concentrated on a junction between the penetrating conductor and the wiring, wherefore the junction becomes susceptible to a break, and this can lead to deterioration in the electrical reliability of the wiring board.

SUMMARY

The invention provides a wiring board and a mounting structure thereof, which satisfy the requirement to achieve improvement in electrical reliability.

A wiring board in accordance with one embodiment of the invention includes an inorganic insulating layer provided with a penetrating hole, and a penetrating conductor disposed inside the penetrating hole. The inorganic insulating layer includes first inorganic insulating particles connected to each other and second inorganic insulating particles that are larger in particle size than the first inorganic insulating particles and are connected to each other via the first inorganic insulating particles, and also has, at an inner wall of the penetrating hole, a protrusion including at least part of the second inorganic insulating particle. The protrusion is covered with the penetrating conductor.

A mounting structure in accordance with one embodiment of the invention includes the above-described wiring board and an electronic component electrically connected to the wiring board.

According to the wiring board of one embodiment of the invention, a strength of adhesion between the inorganic insulating layer and the penetrating conductor can be increased, so that separation of the inorganic insulating layer and the penetrating conductor can be suppressed. This makes it possible to obtain the wiring board which excels in electrical reliability.

DETAILED DESCRIPTION OF THE PREFERRED EMBODIMENTS

Figure 1:
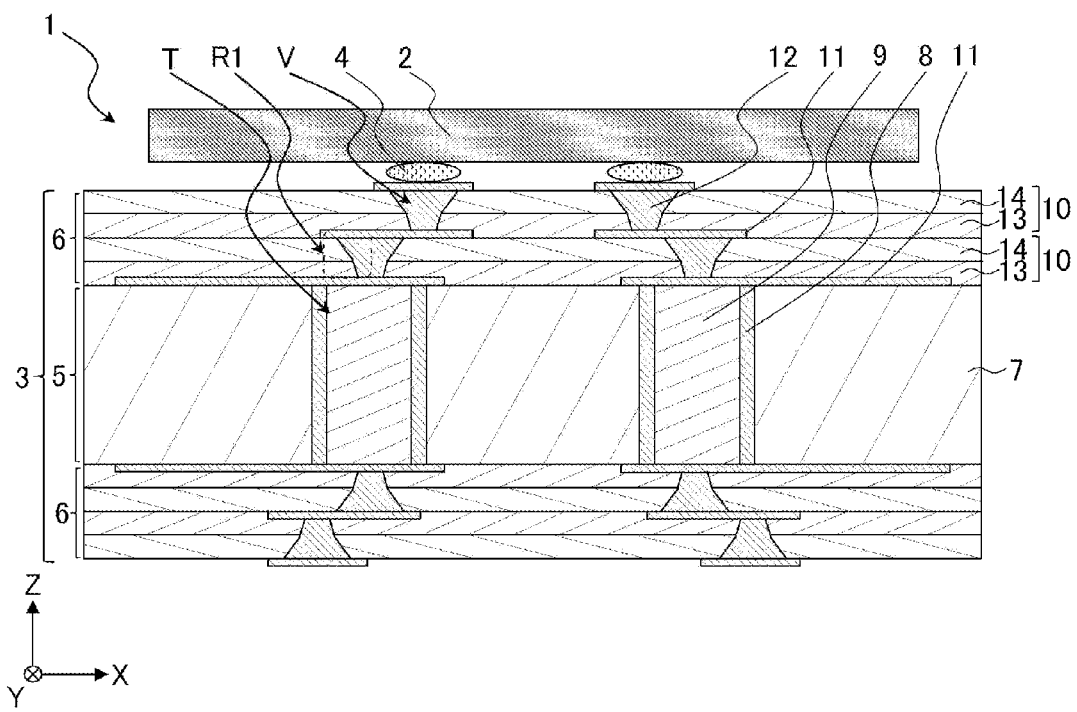
FIG. 1(a) is a thickness-wise sectional view of a mounting structure in accordance with the first embodiment of the invention.
FIG. 1(b) is an enlarged sectional view of the part R1 of the mounting structure shown in FIG. 1 (a)
Figure 1:
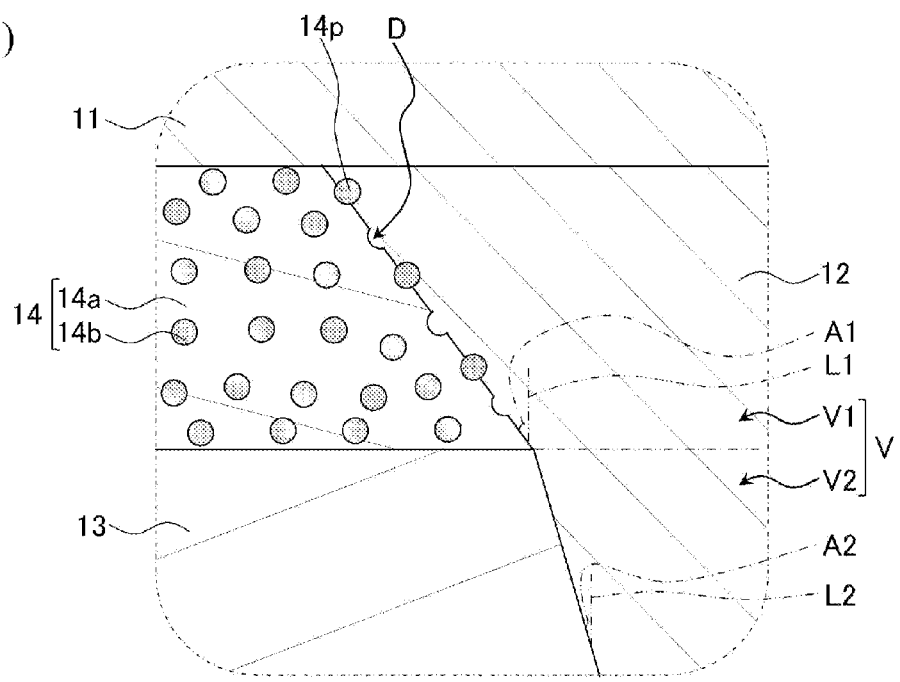

Hereinafter, a mounting structure which includes a wiring board in accordance with one embodiment of the invention will be particularized with reference to the drawings.

A mounting structure 1 as shown in FIG. 1(a) is used for electronic equipment, for example, audio visual equipment of various types, household electrical appliances, communications equipment, computer apparatuses or peripherals thereof, and so forth. This mounting structure 1 includes an electronic component 2 and a wiring board 3 with the electronic component 2 mounted thereon.

The electronic component 2, which is a semiconductor device such for example as IC or LSI, is flip-chip mounted on the wiring board 3 via a bump 4 made of an electrically conducting material such as solder. The base material for forming the electronic component 2 is made of a semiconductor material such for example as silicone, germanium, gallium arsenide, gallium arsenide phosphide, gallium nitride, or silicon carbide. The thickness of the electronic component 2 is adjusted to fall in the range of not less than 0.1 mm and not more than 1 mm, for example.

The wiring board 3 includes a core substrate 5 and a pair of wiring layers 6, the wiring layers 6 being formed at the upper side and the lower side of the core substrate 5, respectively.

The core substrate 5, which is intended to enhance the rigidity of the wiring board 3, as well as to provide continuity between the pair of wiring layers 6, includes a base body 7 provided with a through hole T, a tubular through hole conductor 8 disposed inside the through hole T, and a columnar insulator 9 formed in a region surrounded by the through hole conductor 8.

The base body 7, which is intended to enhance the rigidity of the core substrate 5, includes, for example, a resin portion, a base material covered with the resin portion, and an inorganic insulating filler covered with the resin portion. The thickness of the base body 7 is adjusted to fall in the range of not less than 0.1 mm and not more than 3 mm, for example. Moreover, the thermal expansion coefficient of the base body 7 in the planar direction thereof is adjusted to fall in the range of, for example, not less than 3 ppm/° C. and not more than 20 ppm/° C., and the thermal expansion coefficient of the base body 7 in the thickness direction thereof is adjusted to fall in the range of, for example, not less than 30 ppm/° C. and not more than 50 ppm/° C. Note that the base body 7 does not necessarily have to include the base material, and it also does not necessarily have to include the inorganic insulating filler.

The thermal expansion coefficient of the base body 7 is measured by a measurement method in compliance with JIS K 7197-1991 using commercially available TMA equipment. Moreover, the dielectric loss tangent, or dielectric dissipation factor of the base body 7 is measured by a dielectric resonator method in compliance with JIS R 1627-1996. In what follows, the thermal expansion coefficient, as well as the dielectric loss tangent, of each of the constituent components will be measured in a manner similar to that adopted for the base body 7.

The resin portion of the base body 7, which constitutes the principal part of the base body 7, is made of thermosetting resin such for example as epoxy resin, bismaleimide triazine resin, cyanate resin, polyphenylene ether resin, wholly aromatic polyamide resin, or polyimide resin.

The base material of the base body 7 is intended to enhance the rigidity of the base body 7. As the base material, a fiber-made cloth, a nonwoven fabric, or a fabric made by arranging fibers in one direction can be used, and, as the fiber, for example, glass fiber, resin fiber, carbon fiber, or metal fiber can be used.

The inorganic insulating filler of the base body 7, which is intended to reduce the thermal expansion coefficient of the base body 7, as well as to enhance the rigidity of the base body 7, is composed of a plurality of particles made of an inorganic insulating material such for example as silicon oxide, aluminum oxide, aluminum nitride, aluminum hydroxide, or calcium carbonate. In the particles of the inorganic insulating filler, the particle size is adjusted to fall in the range of, for example, not less than 0.5 µm and not more than 5.0 µm, and the thermal expansion coefficient is adjusted to fall in the range of, for example, not less than 0 ppm/° C. and not more than 15 ppm/° C. Moreover, in the inorganic insulating filler, the ratio of the volume of the inorganic insulating filler to the total volume of the resin portion and the inorganic insulating filler, is adjusted to fall in the range of not less than 3% by volume and not more than 60% by volume, for example.

The through hole T passes completely through the base body 7 in its thickness direction, and is given a cylindrical shape. The maximum diameter of the through hole T is adjusted to fall in the range of not less than 15 µm and not more than 180 µm, for example.

The through hole conductor 8, which is intended to permit electrical connection between the upper wiring layer 6 and the lower wiring layer 6 of the core substrate 5, is made of an electrically conducting material such for example as copper, silver, gold, nickel, or an alloy of such metal materials. Moreover, the thermal expansion coefficient of the through hole conductor 8 in its planar direction and thickness direction as well adjusted to fall in the range from not less than 14 ppm/° C. and not more than 18 ppm/° C.

The insulator 9, which is intended to support a via-conductor 12 which will hereafter be described, is made of a resin material such for example as polyimide resin, acrylic resin, epoxy resin, cyanate resin, fluorine resin, silicone resin, polyphenylene ether resin, or bismaleimide triazine resin.

Meanwhile, as has already been described, the pair of wiring layers 6 is formed on the upper and lower surfaces, respectively, of the core substrate 5. The wiring layer 6 includes an insulating layer 10 provided with a via-hole (penetrating hole) V, a conductive layer 11 formed partly on the base body 7 or on the insulating layer 10, and a via-conductor (penetrating conductor) 12 formed in the via-hole V so as to be connected to the conductive layer 11.

The insulating layer 10, which serves as an insulating member for preventing occurrence of electrical shortings between the conductive layers 11, includes a resin layer 13 formed on the base body 7 or on other different insulating layer 10 and an inorganic insulating layer 14 formed on the resin layer 13.

The resin layer 13, which is interposed between the base body 7 and the inorganic insulating layer 14 or between the individual inorganic insulating layers 14, serves as a bonding member for bonding the base body 7 and the inorganic insulating layer 14 together or a bonding member for bonding the inorganic insulating layers 14 together. Moreover, being lower in Young's modulus than the inorganic insulating layer 14 and prone to elastic deformation, the resin layer 13 allows, when the wiring board 3 is subjected to stress, reduction of the stress applied to the inorganic insulating layer 14 and thus suppression of cracking that occurs in the inorganic insulating layer 14 due to the stress.

The resin layer 13 includes a resin portion and an inorganic insulating filler covered with the resin portion. The thickness of the resin layer 13 is adjusted to fall in the range of not less than 3 µm and not more than 30 µm, for example. Moreover, the thermal expansion coefficient of the resin layer 13 in its planar and thickness directions is adjusted to fall in the range of not less than 20 ppm/° C. and not more than 50 ppm/° C., for example. Further, the Young's modulus of the resin layer 13 is adjusted to fall in the range of not less than 0.2 GPa and not more than 20 GPa, for example. Note that the resin layer 13 does not necessarily have to include the inorganic insulating filler.

The Young's modulus of the resin layer 13 is measured by a method in compliance with ISO 14577-1: 2002 using Nano Indenter XP manufactured by MTS Systems Corporation. In what follows, the Young's modulus of each of the constituent components will be measured in a manner similar to that adopted for the resin layer 13.

The resin portion of the resin layer 13, which constitutes the principal part of the resin layer 13, is made of thermosetting resin such for example as epoxy resin, bismaleimide triazine resin, cyanate resin, polyphenylene ether resin, wholly aromatic polyamide resin, or polyimide resin.

The inorganic insulating filler of the resin layer 13 is similar in structure and effect to the inorganic insulating filler contained in the base body 7.

The inorganic insulating layer 14, being made of an inorganic insulating material which is higher in rigidity than a resin material, has the capability of enhancing the rigidity of the wiring board 3. Moreover, since the inorganic insulating layer 14 is lower in thermal expansion coefficient than a resin material, it is possible to allow the thermal expansion coefficient of the wiring board 3 in its planar direction to approximate the thermal expansion coefficient of the electronic component 2 in its planar direction, and thereby suppress warpage of the wiring board 3 caused by thermal stress.

The inorganic insulating layer 14 can be made of an inorganic insulating material such for example as silicon oxide, aluminum oxide, boron oxide, magnesium oxide, or calcium oxide, among which silicon oxide is desirable for use in light of its low dielectric loss tangent and low thermal expansion coefficient.

Moreover, it is preferable that the inorganic insulating layer 14 is made of an inorganic insulating material in amorphous (non-crystalline) form. As a consequence, in contrast to an inorganic insulating material in crystalline form, the inorganic insulating layer 14 allows relaxation of thermal expansion anisotropy ascribable to a crystalline structure. Accordingly, in the case of applying heat to the wiring board 3, when the heated wiring board 3 is cooled down, the degree of shrinkage of the inorganic insulating layer 14 can be rendered uniform throughout its entirety in each direction, wherefore occurrence of cracking in the inorganic insulating layer 14 can be suppressed.

As the inorganic insulating material in amorphous form, for example, a material having a silicon oxide content of greater than or equal to 90% by mass can be used, and in particular a material having a silicon oxide content of 100% by mass is desirable for use. In the case of adopting a material having a silicon oxide content of less than 100% by mass, it is possible to use a material which contains, in addition to silicon oxide, other inorganic insulating substance such for example as aluminum oxide, titanium oxide, magnesium oxide, or zirconium oxide. Note that, in the inorganic insulating material in amorphous form, for example, the region of crystal phase is adjusted to be less than 10% by volume, more preferably less than 5% by volume.

The volumetric proportion of the crystal phase region of silicon oxide is determined by measurement as follows. As a first step, a plurality of comparative samples that contain hundred-percent crystallized sample powder and amorphous powder in varying ratio are prepared, and, through the measurement of the comparative samples by means of X-ray diffraction method, a calibration curve indicative of the relative relationship between the measured value and the volumetric proportion of the crystal phase region is produced. Next, a specimen to be measured is subjected to measurement using the X-ray diffraction method, and comparison is made between the measured value and the calibration curve for calculation of volumetric proportion of crystal phase region on the basis of the measured value, whereby the volumetric proportion of the crystal phase region in the specimen can be determined.

For example, the inorganic insulating layer 14 is shaped like a flat plate, and the thickness thereof is adjusted to fall in the range of not less than 3 μm and not more than 30 μm, for example. Moreover, the Young's modulus of the inorganic insulating layer 14 is adjusted to fall in the range of, for example, not less than 10 GPa and not more than 100 GPa, and/or is adjusted to be not less than 2 times and not more than 20 times the Young's modulus of the resin layer 13, for example. Further, the thermal expansion coefficient of the inorganic insulating layer 14 in its planar and thickness directions is adjusted to fall in the range of, for example, not less than 0 ppm/° C. and not more than 10 ppm/° C., and/or is adjusted to be not more than 0.01 times and not more than 0.02 times the thermal expansion coefficient of the resin layer 13 in its planar and thickness directions, for example.

Meanwhile, as shown in FIG. 1(b), the inorganic insulating layer 14 contains first inorganic insulating particles 14a and second inorganic insulating particles 14b that are larger in particle size than the first inorganic insulating particles 14a. The first inorganic insulating particles 14a and the second inorganic insulating particles 14b can be made of the above-described inorganic insulating material constituting the inorganic insulating layer 14. Moreover, the inorganic insulating layer 14 contains the first inorganic insulating particles 14a in an amount of, for example, not less than 20% by volume and not more than 90% by volume, and contains the second inorganic insulating particles 14b in an amount of, for example, not less than 10% by volume and not more than 80% by volume.

Figure 2:
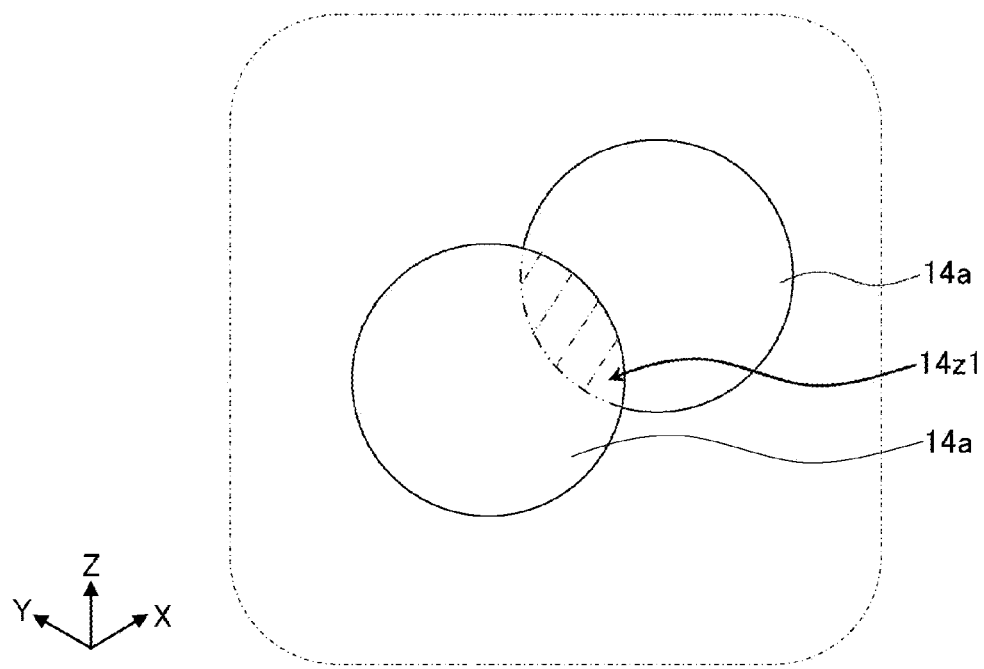
FIG. 2(a) is a view schematically showing the state of connection between two first inorganic insulating particles.
FIG. 2(b) is an enlarged thickness-wise sectional view of an inorganic insulating layer, illustrating the structure of connection between the first and second inorganic insulating particles.
Figure 2:
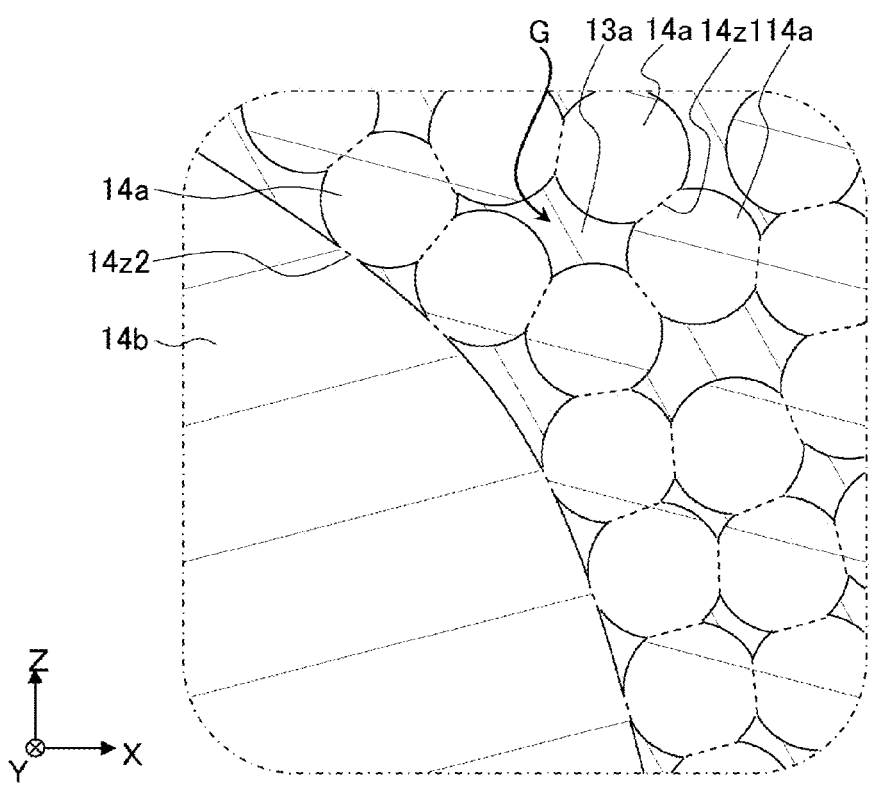

The first inorganic insulating particle 14a is smaller in particle size than the second inorganic insulating particle 14b, and, as shown in FIG. 2(a), the first inorganic insulating particles 14a are connected together, and are also connected to the second inorganic insulating particle 14b. This makes it possible to densify the inorganic insulating layer 14 and thereby enhance the rigidity of the inorganic insulating layer 14. Note that a region of connection between the individual first inorganic insulating particles 14a will be defined as a connected region 14az. As can be seen from a first connected region 14z1 as shown in FIG. 2(a), the first inorganic insulating particles 14a are connected together via a necked-down configuration. Moreover, as shown in FIG. 2(b), the first inorganic insulating particle 14a is, as is the case with the connection between the first inorganic insulating particles 14a, connected to the second inorganic insulating particle 14b via a second connected region 14z2 which is also given a necked-down configuration. Note that a gap G resulting from the necked-down configuration is filled with part of the resin layer 13 (filling part 13a).

It is preferable that the first inorganic insulating particles 14a are designed to have a fine particle size in the range of not less than 3 nm and not more than 110 nm. This makes it possible to densify the inorganic insulating layer 14. Moreover, since the first inorganic insulating particles 14a are connected firmly together at a temperature lower than the crystallization onset temperature thereof, it is possible to increase the strength of connection between the inorganic insulating particles in the inorganic insulating layer 14 in an amorphous state, and thereby suppress occurrence of cracking. Note that, when the first inorganic insulating particles 14a have a fine particle size in the range of not less than 3 nm and not more than 110 nm, the atoms of the first inorganic insulating particles 14a, in particular, the atoms at the surfaces of the particles move actively, wherefore it can be expected that the first inorganic insulating particles 14a will be connected firmly together even under low-temperature conditions such as a condition of a temperature lower than the crystallization onset temperature.

Moreover, it is preferable that the first inorganic insulating particle 14a has a spherical shape. This makes it possible to decrease the interstices between the first inorganic insulating particles 14a, and thereby densify the interior structure of the inorganic insulating layer 14.

The second inorganic insulating particle 14b is larger in particle size than the first inorganic insulating particle 14a. As a consequence, when a crack appears in the inorganic insulating layer 14, upon the crack being developed to reach the second inorganic insulating particle 14b, the crack propagates so as to be diverted along the surface of the second inorganic insulating particle 14b having a larger particle size, wherefore much energy is required for the propagation of the crack and thus crack propagation can be suppressed. Accordingly, since the crack is less likely to reach the conductive layer 11, it is possible to suppress a break of the conductive layer 11 that arises from the crack, and thereby obtain the wiring board 3 which excels in electrical reliability.

Although the strength of connection between the second inorganic insulating particles 14b tends to be low because of their large particle size, since the second inorganic insulating particles 14b are connected together via the first inorganic insulating particles 14a having a smaller particle size, it is possible to suppress occurrence of cracking that is caused by separation of the second inorganic insulating particles 14b.

Moreover, it is preferable that the second inorganic insulating particles 14b are designed to have a particle size in the range of not less than 0.5 μm and not more than 5 μm. By adjusting the particle size of the second inorganic insulating particles 14b to be greater than or equal to 0.5 μm, crack propagation in the inorganic insulating layer 14 can be prevented effectively. Moreover, by adjusting the particle size of the second inorganic insulating particles 14b to be less than or equal to 5 μm, it is possible to increase the area of contact per unit mass between the first inorganic insulating particle 14a and the second inorganic insulating particle 14b, and thereby increase the strength of connection between the first inorganic insulating particle 14a and the second inorganic insulating particle 14b.

The first inorganic insulating particle 14a and the second inorganic insulating particle 14b are identified by observation of the polished surface or fracture section of the inorganic insulating layer 14 using a field emission-type electron microscope. Moreover, the content of the first inorganic insulating particles 14a and the content of the second inorganic insulating particles 14b (% by volume) in the inorganic insulating layer 14 are determined by a method involving a step of taking a photograph of the polished surface of the inorganic insulating layer 14 by a field emission-type electron microscope, a step of measuring the ratio between the area of the first inorganic insulating particles 14a and the area of the second inorganic insulating particles 14b (% by area) in the inorganic insulating layer 14 by an image analyzer or the like apparatus, and a step of calculating the mean value of the observation data that is assumed to be the content (% by volume). Further, the particle size of the first inorganic insulating particles 14a and the particle size of the second inorganic insulating particles 14b are determined by observing the polished surface or fracture section of the inorganic insulating layer 14 by a field emission-type electron microscope, taking a photograph of the section which has been enlarged so that the contained particles ranging in number of not less than 20 and not more than 50 can be seen, and measuring the maximum diameter of each particle in the enlarged section.

Moreover, preferably, the second inorganic insulating particles 14b are spaced apart, with the first inorganic insulating particles 14a lying between them, and more preferably the second inorganic insulating particle 14b is covered with the first inorganic insulating particles 14a. This makes it possible to decrease the region of contact between the second inorganic insulating particles 14b that is low in connection strength and is thus prone to separation, and thereby suppress occurrence and propagation of a crack that stem from the contact region.

Moreover, it is preferable that the second inorganic insulating particle 14b has a spherical shape. This makes it possible to disperse the stress on the surface of the second inorganic insulating particle 14b, and thereby suppress occurrence of cracking in the inorganic insulating layer 14 that arises from the surface of the second inorganic insulating particle 14b.

Further, it is preferable that the second inorganic insulating particle 14b is higher in Young's modulus than the first inorganic insulating particle 14a. This makes it possible to suppress, when a crack is developed to reach the second inorganic insulating particle 14b, propagation of the crack through the interior of the second inorganic insulating particle 14b, and thereby suppress crack propagation in the inorganic insulating layer 14. The Young's modulus of the first inorganic insulating particle 14a is adjusted to fall in the range of not less than 7 GPa and not more than 17 GPa, for example. On the other hand, the Young's modulus of the second inorganic insulating particle 14b is adjusted to fall in the range of, for example, not less than 50 GPa and not more than 70 GPa, and/or is adjusted to be not less than 3 times and not more than 10 times the Young's modulus of the first inorganic insulating particle, for example.

It is also preferable that the first inorganic insulating particle 14a and the second inorganic insulating particle 14b are made of the same material. This makes it possible to suppress cracking that occurs in the inorganic insulating layer 14 due to the difference in material characteristics between the first inorganic insulating particle 14a and the second inorganic insulating particle 14b.

The conductive layer 11, which is formed on the inorganic insulating layer 14, serves as grounding wiring, power supply wiring, or signal wiring. The conductive layer 11 can be made of an electrically conducting material such for example as copper, silver, gold, nickel, or an alloy of such metal materials, among which copper is desirable for use in light of its high electrical conductivity. Moreover, the thickness of the conductive layer 11 is adjusted to fall in the range of not less than 3 μm and not more than 20 μm. Further, the thermal expansion coefficient of the conductive layer 11 in its planar and thickness directions is adjusted to fall in the range of not less than 14 ppm/° C. and not more than 18 ppm/° C., for example. Note that the thermal expansion coefficient of copper is about 17 ppm/° C.

The via-hole V, which passes through the insulating layer 10 in its thickness direction, has a circular bottom and is tapered off, or equivalently, it is so shaped that its diameter becomes smaller gradually from the inorganic insulating layer 14 side toward the resin layer 13 side. The via-hole V includes a first penetrating portion V1 formed in the inorganic insulating layer 14 and a second penetrating portion V2 formed in the resin layer 13. The maximum diameter of the first penetrating portion V1 is adjusted to fall in the range of, for example, not less than 15 μm and not more than 50 μm, and the minimum diameter of the first penetrating portion V1 is adjusted to fall in the range of not less than 13 μm and not more than 25 μm, for example. The maximum diameter of the second penetrating portion V2 is adjusted to fall in the range of, for example, not less than 13 μm and not more than 25 μm, and the minimum diameter of the second penetrating portion V2 is adjusted to fall in the range of not less than 10 μm and not more than 20 μm, for example.

The via-conductor 12 is intended to permit connection between the conductive layers 11 spaced apart in the thickness direction. The via-conductor 12 is made of an electrically conducting material such for example as copper, silver, gold, nickel, or an alloy of such metal materials, among which copper is desirable for use in light of its high electrical conductivity. Moreover, the thermal expansion coefficient of the via-conductor 12 in its planar and thickness directions is adjusted to fall in the range of, for example, not less than 14 ppm/° C. and not more than 18 ppm/° C., and/or is adjusted to be, for example, not less than 28% and not more than 60% of the thermal expansion coefficient of the resin layer 13 in its planar and thickness directions, and/or is adjusted to be not less than 23 times and not more than 30 times the thermal expansion coefficient of the inorganic insulating layer 14 in its planar and thickness directions, for example.

In the wiring board 3 of the present embodiment thus far described, the insulating layer 10 includes the resin layer 13 and the inorganic insulating layer 14, and also the thermal expansion coefficient of the resin layer 13 in its thickness direction is greater than the thermal expansion coefficient of the via-conductor 12 in its thickness direction, and the thermal expansion coefficient of the inorganic insulating layer 14 in its thickness direction is smaller than the thermal expansion coefficient of the via-conductor 12 in its thickness direction. Therefore, in contrast to a case where the insulating layer 10 is composed solely of the resin layer 13 or the insulating layer 10 is composed solely of the inorganic insulating layer 14, the difference in thickness-wise thermal expansion coefficient between the insulating layer 10 and the via-conductor 12 can be reduced. Accordingly, when the wiring board 3 is subjected to heat, the thickness-wise thermal stress applied in between the insulating layer 10 and the via-conductor 12 can be lessened, wherefore separation of the insulating layer 10 and the via-conductor 12 can be suppressed. This makes it possible to suppress concentration of thermal stress on a junction between the via-conductor 12 and the conductive layer 11 that results from the separation, and thereby suppress occurrence of a break in the junction, with consequent improvement in the electrical reliability of the wiring board 3.

It is noted that, as compared with the resin layer 13, the inorganic insulating layer 14 has a higher Young's modulus and is thus less prone to elastic deformation, wherefore the thermal stress applied in between the inorganic insulating layer 14 and the via-conductor 12 cannot be lessened easily by the action of elastic deformation.

Figure 3:
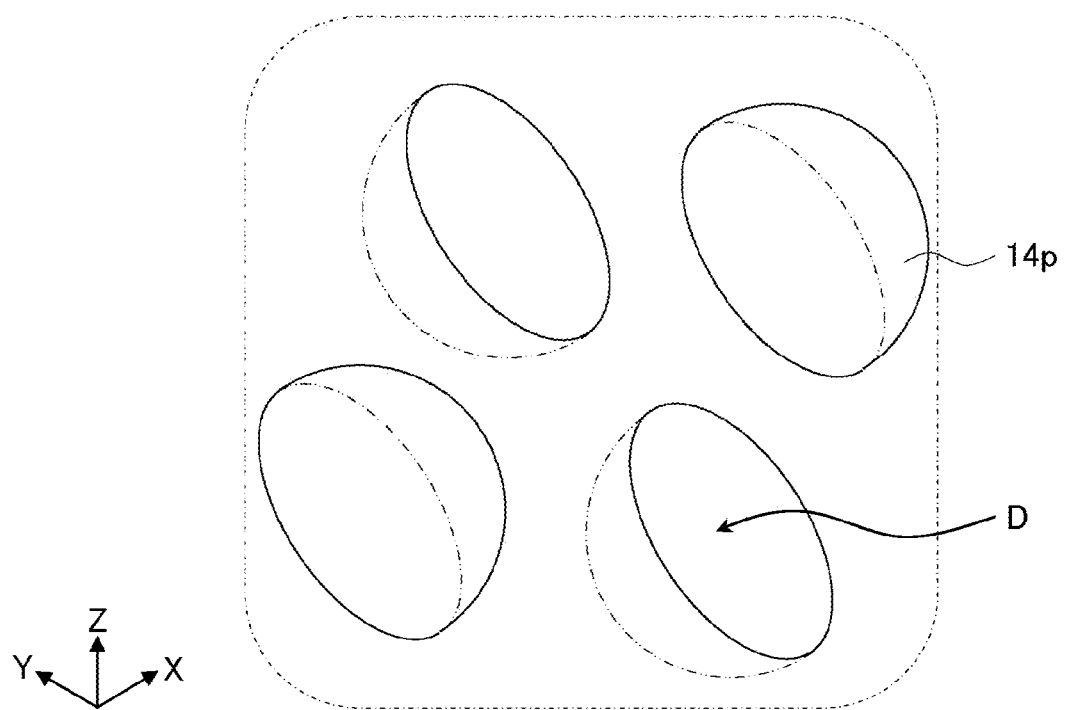
FIG. 3 is a view schematically showing a protrusion and a recess at the inner wall of a first penetrating portion.
Figure 4:
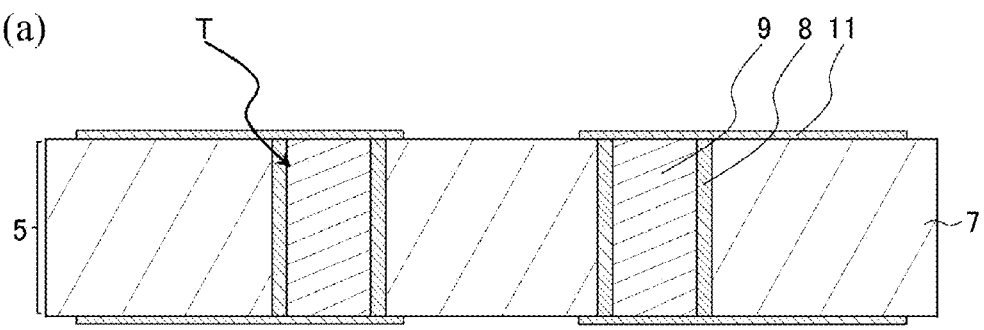
FIG. 4(a), FIG. 4(b), and FIG. 4(c) are thickness-wise sectional views for explaining process steps to produce the mounting structure shown in FIG. 1, and FIG. 4 (d) is an enlarged sectional view of the part R2 shown in FIG. 4 (c)
Figure 4:
Figure 4:
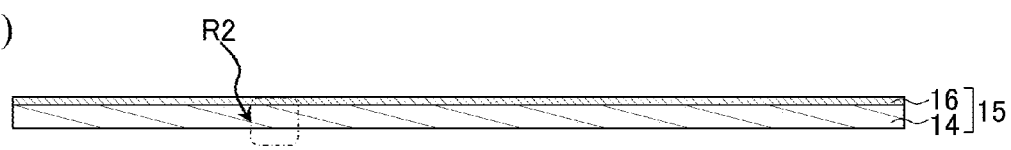
Figure 4:
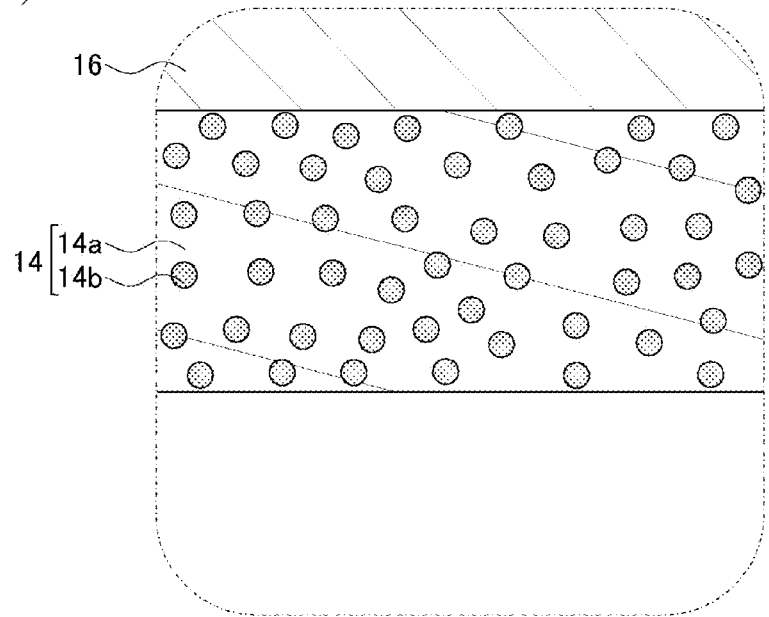
Figure 5:
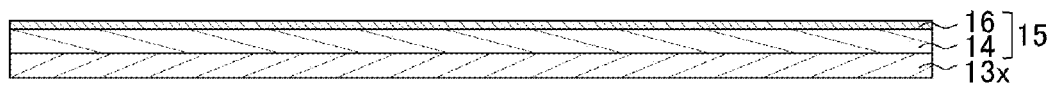
FIG. 5(a), FIG. 5(b), and FIG. 5(c) are thickness-wise sectional views for explaining process steps to produce the mounting structure shown in FIG. 1.
Figure 5:
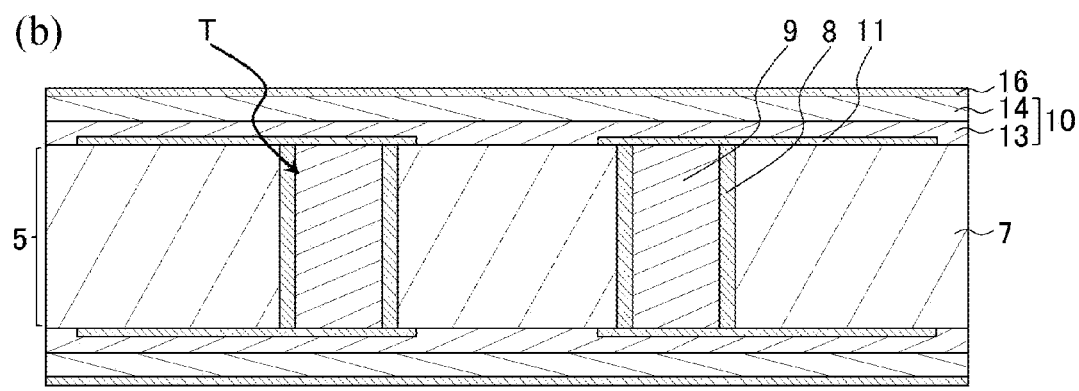
Figure 5:
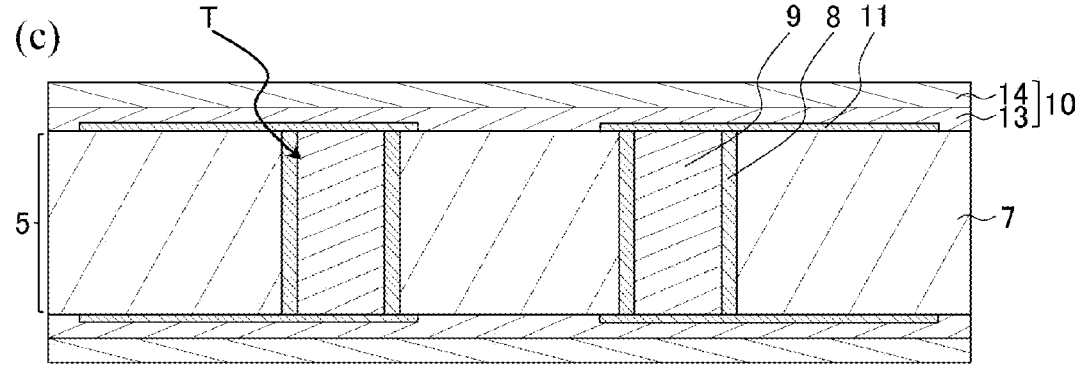
Figure 6:
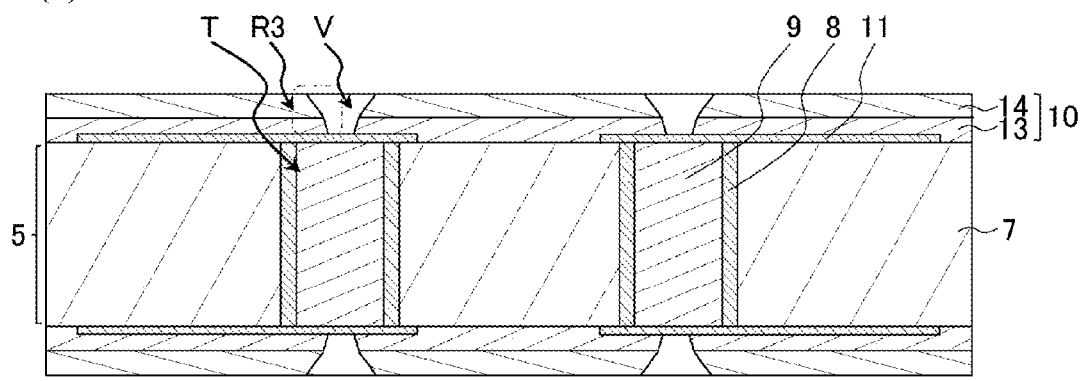
FIG. 6(a) is a thickness-wise sectional view for explaining process steps to produce the mounting structure shown in FIG. 1.
FIG. 6(b) is an enlarged sectional view of the part R3 shown in FIG. 6(a)
Figure 6:
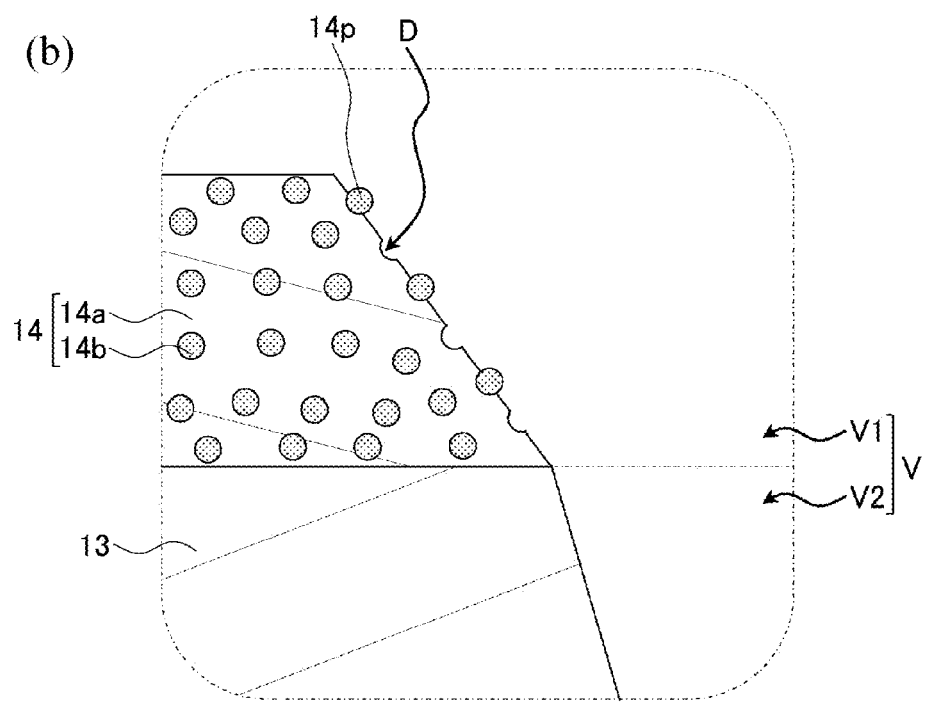
Figure 7:
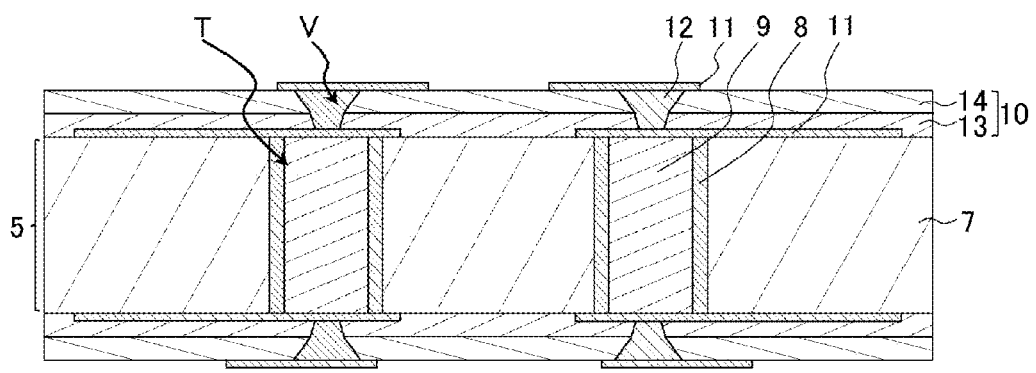
FIG. 7(a) and FIG. 7(b) are thickness-wise sectional views for explaining process steps to produce the mounting structure shown in FIG. 1.
Figure 7:
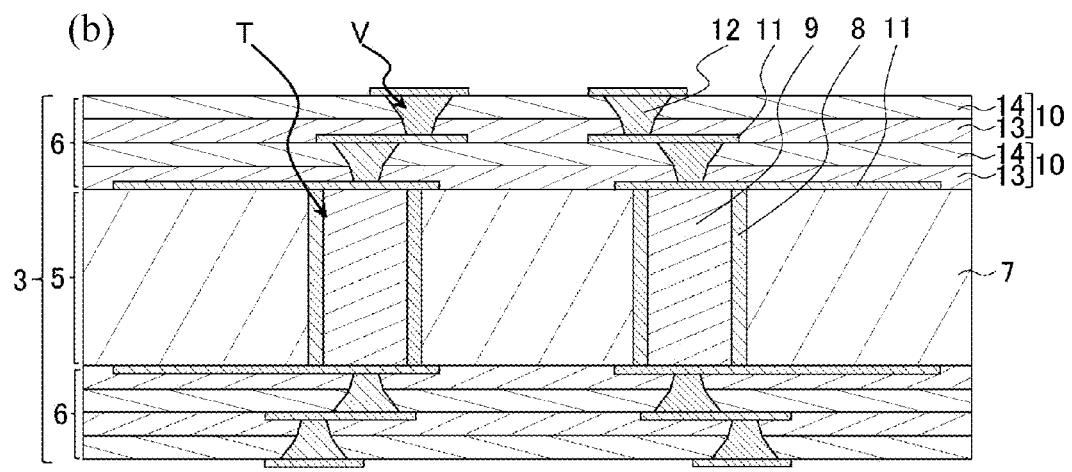

In this regard, in the wiring board 3 of this embodiment, as shown in FIG. 1(b) and FIG. 3, the inorganic insulating layer 14 has, at the inner wall of the via-hole V, or more specifically the inner wall of the first penetrating portion V1, a protrusion 14p including at least part of the second inorganic insulating particle 14b, and the protrusion 14p is covered with the via-conductor 12. As a consequence, by virtue of an anchor effect, the strength of adhesion between the inorganic insulating layer 14 and the via-conductor 12 can be increased, and this helps suppress separation of the inorganic insulating layer 14 and the via-conductor 12 that is caused by thermal stress. This makes it possible to suppress separation of the insulating layer 10 and the via-conductor 12 that originates from the foregoing separation, and thereby obtain the wiring board 3 which excels in electrical reliability. Note that the height of a protrusion 14p is adjusted to fall in the range of not less than 0.5 μm and not more than 3 μm, for example.

Thus, by forming the protrusion 14p at the inner wall of the first penetrating portion V1, the ten-point average roughness (Rz) of the inner wall of the first penetrating portion V1 is increased. It is preferable that the ten-point average roughness of the inner wall of the first penetrating portion V1 is higher than the ten-point average roughness of the inner wall of the via-hole V existing in the resin layer 13, or more specifically the inner wall of the second penetrating portion V2. By increasing the ten-point average roughness of the inner wall of the first penetrating portion V1, the strength of adhesion between the inorganic insulating layer 14 and the via-conductor 12 that have difficulties in thermal stress reduction can be increased, and, by decreasing the ten-point average roughness of the inner wall of the second penetrating portion V2, it is possible to planarize the surface of the via-conductor 12 and thereby achieve improvement in radio-frequency signal transmission characteristics. Note that the ten-point average roughness of the inner wall of the first penetrating portion V1 is adjusted to fall in the range of, for example, not less than 0.2 μm and not more than 2 μm, and the ten-point average roughness of the inner wall of the second penetrating portion V2 is adjusted to fall in the range of not less than 0.1 μm and not more than 0.5 μm, for example. Moreover, the ten-point average roughness of the inner wall of the first penetrating portion V1 is adjusted to be not less than 2 times and not more than 10 times the ten-point average roughness of the inner wall of the second penetrating portion V2.

It is preferable that the ten-point average roughness of the inner wall of the first penetrating portion V1 is higher than the ten-point average roughness of the main surface (one main surface located adjacent to the conductive layer 11 or the other main surface located away from the conductive layer 11) of the inorganic insulating layer 14. By increasing the ten-point average roughness of the inner wall of the first penetrating portion V1, the strength of adhesion between the inorganic insulating layer 14 and the via-conductor 12 that have difficulties in thermal stress reduction can be increased, and, by decreasing the ten-point average roughness of the main surface of the inorganic insulating layer 14, it is possible to minimize non-uniformity in the thickness of the inorganic insulating layer 14. Moreover, by decreasing the ten-point average roughness of one main surface of the inorganic insulating layer 14 that is located adjacent to the conductive layer 11, it is possible to impart greater evenness to the main surface of the inorganic insulating layer 14, and thereby improve the electrical reliability of the conductive layer 11 formed on the inorganic insulating layer 14 and also render the conductive layer 11 even finer. The ten-point average roughness of each of the main surfaces of the inorganic insulating layer 14 is adjusted to fall in the range of, for example, not less than 0.1 μm and not more than 0.3 μm, and/or is adjusted to be not less than 10% and not more than 30% of the ten-point average roughness of the first penetrating portion V1, for example.

It is preferable that the second inorganic insulating particle 14b included in the protrusion 14p has a spherical shape. This makes it possible to render the surface of the protrusion 14p a curvilinear surface or even a spherical surface, and thereby disperse the thermal stress applied in between the inorganic insulating layer 14 and the via-conductor 12 at the surface of the protrusion 14p. Accordingly, occurrence of cracking in the via-conductor 12 that arises from the surface of the protrusion 14p can be suppressed, and this helps suppress occurrence of a break in the via-conductor 12. Moreover, by designing the protrusion 14p to have a curvilinear surface, in contrast to a case where the protrusion 14p has a pointed front end, it is possible to achieve improvement in transmission characteristics for radio-frequency signals that are to be transmitted by the surface of the via-conductor 12.

It is preferable that the inorganic insulating layer 14 has, at the inner wall of the first penetrating portion V1, a recess D which is created as the result of separation of the second inorganic insulating particle 14b, at least part of which is buried in the inorganic insulating layer 14, from the inorganic insulating layer 14, and the recess D is filled with part of the via-conductor 12. As a consequence, the inner wall of the first penetrating portion V1 is provided with the protrusion 14p and the recess D as well, and in this case, in contrast to the case of forming the protrusion 14p alone, the ten-point average roughness of the inner wall of the first penetrating portion V1 can be increased and also the anchor effect can be enhanced, with a consequent increase in the strength of adhesion between the inorganic insulating layer 14 and the via-conductor 12. Note that the depth of the recess D is adjusted to fall in the range of not less than 0.5 μm and not more than 3 μm, for example.

It is preferable that the second inorganic insulating particle 14b which is separated from the inorganic insulating layer 14 to create the recess D has a spherical shape. This makes it possible to render the inner surface of the recess D a curvilinear surface or even a spherical surface, and thereby disperse the thermal stress applied in between the inorganic insulating layer 14 and the via-conductor 12 at the inner surface of the recess D. Moreover, by designing the recess D to have a curvilinear surface, in contrast to a case where the recess D has a pointed bottom, it is possible to achieve improvement in transmission characteristics for radio-frequency signals that are to be transmitted by the surface of the via-conductor 12.

It is noted that the thermal expansion coefficient of the inorganic insulating layer 14 in its planar direction is greater than the thermal expansion coefficient of the via-conductor 12 in its planar direction. Accordingly, after the wiring board 3 is subjected to heat, in a subsequent cooling process, the via-conductor 12 shrinks in the planar direction to a larger extent than does the inorganic insulating layer 14, wherefore thermal stress in the planar direction is likely to be applied in between the via-conductor 12 and the inorganic insulating layer 14.

In this regard, in the wiring board 3 of this embodiment, a first inclination angle A1, which is the angle of inclination of the inner wall of the first penetrating portion V1 relative to the penetrating direction of the via-hole V, is greater than a second inclination angle A2 which is the angle of inclination of the inner wall of the second penetrating portion V2 relative to the penetrating direction. By setting the first inclination angle A1 at a larger angle, it is possible to allow the extending direction of the protrusion 14p to approximate a direction perpendicular to the planar direction of the inorganic insulating layer 14, wherefore the anchor effect of the protrusion 14p can be enhanced against thermal stress in the planar direction, with a consequent increase in the strength of adhesion between the inorganic insulating layer 14 and the via-conductor 12. Moreover, by setting the second inclination angle A2 at a smaller angle, it is possible to increase the area of the bottom of the second penetrating portion V2 and thereby increase the strength of adhesion between the via-conductor 12 and the conductive layer 11. The first inclination angle A1 is adjusted to fall in the range of not less than 10° and not more than 40°, for example, and the second inclination angle A2 is adjusted to fall in the range from not less than 1° and not more than 10°, for example. Moreover, the first inclination angle A1 is adjusted to be not less than 1.3 times and not more than 3 times the second inclination angle A2.

The first inclination angle A1 refers to the angle defined by an imaginary line segment L1 extending in parallel with the penetrating direction from the interior of the first penetrating portion V1 to the inner wall of the first penetrating portion V1, and the inner wall of the first penetrating portion V1. Likewise, the second inclination angle A2 refers to the angle defined by an imaginary line segment L2 extending in parallel with the penetrating direction from the interior of the second penetrating portion V2 to the inner wall of the second penetrating portion V2, and the inner wall of the second penetrating portion V2.

Thus, the mounting structure 1 as above described delivers desired performance capabilities through the driving or control operation of the electronic component 2 with the supply of power and signals via the wiring board 3.

Next, a method for manufacturing the above-described mounting structure 1 will be described with reference to FIGS. 4 to 7.

(Production of Core Substrate)

(1) As shown in FIG. 4(a), the core substrate 5 is produced. Specifically, the production is carried out as follows.

As a first step, for example, a plurality of resin sheets in an uncured state are stacked on top of each other in layers, with copper foil laminated on the outermost layer, and the laminated body is cured by application of heat and pressure, whereupon the base body 7 is formed. Note that the "uncured state" corresponds to the state of ISO 472: 1999-defined Stage A or stage B. Then, the through hole T is formed so as to pass through the base body 7 in the direction of its thickness by means of drill machining, laser machining, or otherwise, for example. Next, the through hole conductor 8 is formed by depositing an electrically conducting material on the inner wall of the through hole by means of electroless plating, electroplating, vapor deposition, CVD technique, sputtering, or otherwise, for example. Next, the insulator 9 is formed by charging a resin material or the like into the through hole conductor 8. Then, after the depositing of an electrically conducting material on the exposed part of the insulator 9, the copper foil is subjected to patterning by means of heretofore known technique such as photolithography, etching, or the like to form the conductive layer 11.

In the manner as above described, the core substrate 5 can be produced.

(Production of Laminate Sheet)

(2) As shown in FIG. 4(b), there are prepared an inorganic insulating sol 14x composed of solid matter containing the first inorganic insulating particles 14a and the second inorganic insulating particles 14b and a solvent, and copper foil 16 which acts as a support member, and then the inorganic insulating sol 14x is applied to one main surface of the copper foil 16.

It is preferable that the inorganic insulating sol 14x contains the solid matter in an amount of not less than 10% by volume and not more than 50% by volume, and contains the solvent in an amount of not less than 50% by volume and not more than 90% by volume. By adding the solvent in an amount of not less than 50% by volume of the inorganic insulating sol 14x, it is possible to reduce the viscosity of the inorganic insulating sol 14x and thereby impart greater evenness to the inorganic insulating layer 14 which is made of the solid matter of the inorganic insulating sol 14x. Moreover, by adding the solvent in an amount of not more than 90% by volume of the inorganic insulating sol 14x, it is possible to increase the content of solid matter in the inorganic insulating sol 14x and thereby provide gains in the productivity of the inorganic insulating layer 14.

Moreover, it is preferable that the solid matter of the inorganic insulating sol 14x contains the first inorganic insulating particles 14a in an amount of not less than 20% by volume and not more than 90% by volume, and contains the second inorganic insulating particles 14b in an amount of not less than 10% by volume and not more than 80% by volume. By adding the second inorganic insulating particles 14b in an amount of not less than 10% by volume of the solid matter, in the process step (2) which will hereafter be described, occurrence of cracking in the inorganic insulating layer 14 can be suppressed effectively.

The first inorganic insulating particles 14a can be formed by purification of a silicate compound such as sodium silicate aqueous solution (liquid glass) for chemical precipitation of silicon oxide. The first inorganic insulating particles 14a include third inorganic insulating particles and fourth inorganic insulating particles. The fourth inorganic insulating particles, which are larger in particle size than the third inorganic insulating particles, can be formed under the condition where the time taken for silicon oxide precipitation for the fourth inorganic insulating particles is set to be longer than the time therefor for the third inorganic insulating particles.

It is also preferable that the solid matter of the inorganic insulating sol 14x contains the third inorganic insulating particles in an amount of not less than 10% by volume and not more than 90% by volume, and contains the fourth inorganic insulating particles in an amount of not less than 10% by volume and not more than 40% by volume. By adding the third inorganic insulating particles in an amount of not less than 10% by volume of the solid matter, it is possible to densify the interior structure of the inorganic insulating layer 14, as well as to allow the inorganic insulating layer 14 to get thicker. Moreover, by adding the fourth inorganic insulating particles in an amount of not less than 10% by volume of the solid matter, in the process step (2), occurrence of cracking in between the second inorganic insulating particles 14b of the inorganic insulating layer 14 can be suppressed effectively.

It is desirable to adjust the particle size of the third inorganic insulating particles to be not less than 3 nm. This makes it possible to reduce the viscosity of the inorganic insulating sol 14x and thereby impart greater evenness to the inorganic insulating layer 14 which is made of the solid matter of the inorganic insulating sol 14x.

On the other hand, the second inorganic insulating particles 14b can be formed by a method involving a step of purifying a silicate compound such for example as sodium silicate aqueous solution (liquid glass), a step of spraying the resultant solution containing chemically precipitated silicon oxide into flame, and a step of applying heat at temperatures of not lower than 800° C. and not higher than 1500° C. while suppressing the formation of agglomeration. Since the second inorganic insulating particles 14b are larger in particle size than the first inorganic insulating particles 14a, it is easier to suppress agglomeration formation under high-temperature heating conditions during their formation, wherefore the second inorganic insulating particles can be formed readily under high-temperature heating conditions, and also an increase in Young's modulus can be achieved with ease.

Moreover, it is desirable to adjust the time required for heating in the production of the second inorganic insulating particles 14b to fall in the range of not shorter than 1 second and not longer than 18 seconds. By shortening the heating time, even if heat is applied at temperatures of not lower than 800° C. and not higher than 1500° C., the second inorganic insulating particles 14b are restrained from crystallization and can thus be maintained in an amorphous state.

Moreover, it is preferable that the second inorganic insulating particles 14b are smaller in particle size variations (standard deviation) than the inorganic insulating filler. This allows the second inorganic insulating particles 14b to scatter more evenly within the inorganic insulating layer 14, and, the suppression of agglomeration of the second inorganic insulating particles 14b is conducive to a decrease in the region of contact between the second inorganic insulating particles 14b that is low in connection strength and is thus prone to separation. Note that the standard deviation of particle size for the second inorganic insulating particles 14b is preferably adjusted to be not more than 20% of that for the inorganic insulating filler.

As the solvent, for example, use can be made of a solvent containing an organic solution medium such as methanol, isopropanol, n-butanol, ethylene glycol, ethylene glycol monopropyl ether, methyl ethyl ketone, methyl isobutyl ketone, xylene, propylene grycol monomethyl ether, propylene grycol monomethyl ether acetate, or dimethylacetamide. In particular, the use of a solvent containing methanol, isopropanol, or propylene grycol monomethyl ether is desirable. Thereby, the inorganic insulating sol 14x can be applied evenly, and thus, in the process step (2), the solvent can be evaporated efficiently.

The application of the inorganic insulating sol 14x can be performed by means of a dispenser, a bar coater, a die coater, screen printing, or otherwise, for example.

The inorganic insulating sol 14x applied to one main surface of the copper foil 16 is shaped like a flat plate, and the thickness of the inorganic insulating sol 14x in a dried state is adjusted to fall in the range of not less than 3 µm and not more than 110 µm, for example.

(3) As shown in FIGS. 4(c) and 4(d), after the solvent is evaporated through the drying of the inorganic insulating sol 14x, the remaining solid matter of the inorganic insulating sol 14x is heated to connect the first inorganic insulating particles 14a together, so that the solid matter of the inorganic insulating sol 14x can be turned into the inorganic insulating layer 14, thereby producing a laminate sheet 15 composed of the copper foil 16 and the inorganic insulating layer 14.

Meanwhile, in the method of manufacturing the wiring board 3 of the present embodiment, the inorganic insulating sol 14x contains the first inorganic insulating particles 14a having a smaller particle size. Therefore, by heating the solid matter of the inorganic insulating sol 14x, it is possible to permit easy and firm connection of the first inorganic insulating particle 14a with other first inorganic insulating particle 14a or the second inorganic insulating particle 14b, and thereby form a dense and highly rigid inorganic insulating layer 14 with ease.

Moreover, the inorganic insulating sol 14x further contains the second inorganic insulating particles 14b that are larger in particle size than the first inorganic insulating particles 14a. This allows, when the inorganic insulating particles move closer to each other during the process of evaporation of the solvent of the inorganic insulating sol 14x, a decrease in the interstices between the inorganic insulating particles, and thereby helps lessen the degree of shrinkage of the solid content of the inorganic insulating sol 14x entailed by the evaporation of the solvent existing in the interstices. Accordingly, in the solid content of the inorganic insulating sol 14x that is likely to shrink greatly in the planar direction thereof because of its being shaped like a flat plate, shrinkage along the planar direction can be suppressed, and this helps suppress occurrence of thickness-wise cracking caused by the shrinkage along the planar direction. Moreover, in the event of development of a crack in the inorganic insulating layer 14, the propagation of the crack can be suppressed by virtue of the second inorganic insulating particles 14b that are larger in particle size than the first inorganic insulating particles 14a.

Moreover, in the method of manufacturing the wiring board 3 of this embodiment, the first inorganic insulating particles 14a are designed to have a particle size of not more than 110 nm. This allows, even if the temperature for the heating of the inorganic insulating sol 14x is as low as a level of lower than the crystallization onset temperature of the first inorganic insulating particles 14a as well as the second inorganic insulating particles 14b, the first inorganic insulating particle 14a to make firm connection with other first inorganic insulating particle 14a or the second inorganic insulating particle 14b. This is because, presumably, since the first inorganic insulating particles 14a have an ultra-fine particle size of not more than 110 nm, it follows that the atoms of the first inorganic insulating particles 14a, in particular, the atoms at the surfaces thereof move actively, wherefore the first inorganic insulating particle 14a can be connected firmly to other first inorganic insulating particle 14a or the second inorganic insulating particle 14b even under such a low-temperature condition. Note that, in the case of using a silicon oxide-made material for forming the first inorganic insulating particles 14a, for example, a temperature at which the first inorganic insulating particle 14a can be connected firmly to other first inorganic insulating particle 14a or the second inorganic insulating particle 14b is about 250° C. for a case where the particle size of the first inorganic insulating particles 14a is set to be not more than 110 nm, or is about 150° C. for a case where the particle size is set to be not more than 15 nm.

Moreover, when the individual first inorganic insulating particles 14a, or the first inorganic insulating particle 14a and the second inorganic insulating particle 14b, are heated under such a low-temperature condition, as shown in FIGS. 2(a) and 2(b), the individual first inorganic insulating particles 14a, or the first inorganic insulating particle 14a and the second inorganic insulating particle 14b, can be connected together via the necked-down configuration.

For example, the inorganic insulating sol 14x is dried by heating and air-drying process, and it is preferable that the process temperature is set at not lower than 20° C. and lower than the boiling point of the solvent (when the solvent is made by blending two or more different solution media, the boiling point of a solution medium which is the lowest in boiling point is adopted) and the drying time is adjusted to fall in the range of not shorter than 20 seconds and not longer than 30 minutes. Thereby, the boiling of the solvent can be suppressed, wherefore the second inorganic insulating particles 14b can be charged with higher density. Moreover, since vapors resulting from the boiling of the solvent can be lessened, it is possible to reduce rapid discharge of the vapors from the interior of the inorganic insulating sol 14x to the outside, and thereby decrease thickness-wise interstices caused by the discharge.

It is preferable that the inorganic insulating sol 14x is heated at a temperature of not lower than the boiling point of the solvent and lower than the crystallization onset temperature of the first inorganic insulating particles 14a as well as the second inorganic insulating particles 14b. By adjusting the heating temperature to be not lower than the boiling point of the solvent, the remaining solvent can be evaporated effectively. Moreover, by adjusting the heating temperature to be less than the crystallization onset temperature of the first inorganic insulating particles 14a as well as the second inorganic insulating particles 14b, it is possible to suppress crystallization of the first inorganic insulating particles 14a and the second inorganic insulating particles 14b and thereby increase the proportion of amorphous form, wherefore occurrence of a phenomenon in which the crystallized inorganic insulating layer 14 undergoes shrinkage due to phase transition can be suppressed, with consequent suppression of cracking in the inorganic insulating layer 14. Note that the crystallization onset temperature refers to a temperature at which an amorphous inorganic insulating material starts to crystallize, expressed differently, a temperature at which the volume of the crystal phase region is increased.

Moreover, in the heating of the inorganic insulating sol 14x, the heating temperature is adjusted to fall in the range of, for example, not lower than 100° C. and lower than 600° C., the heating time is adjusted to fall in the range of, for example, not shorter than 0.5 hour and not longer than 24 hours, and the heating process is carried out in an air atmosphere, for example. Note that, when the temperature is raised to not lower than 150° C., in order to inhibit oxidation of the copper foil 16, the inorganic insulating sol 14x is preferably heated in a vacuum, in an inert atmosphere such as an argon atmosphere, or in a nitrogen atmosphere.

In the manner as above described, the laminate sheet 15 can be produced.

(Production of Wiring Board)

(4) As shown in FIGS. 5(a) and 5(b), the insulating layer 10 is formed on the core substrate 5. Specifically, the formation is carried out as follows.

As a first step, as shown in FIG. 5(a), a resin precursor sheet 13x containing uncured thermosetting resin is placed on the inorganic insulating layer 14 of the laminate sheet 15. Next, as shown in FIG. 5(b), the laminate sheet 15 is laminated on each of the upper and lower surfaces of the core substrate 5, with the resin precursor sheet 13x interposed between them, and then heat and pressure are applied to the resultant laminated body in the direction of lamination to cure the thermosetting resin of the resin precursor sheet 13x, so that the resin precursor sheet 13x can be turned into the resin layer 13. During the formation of the resin layer 13, the gap G between the first inorganic insulating particles 14a is filled with part of the resin layer 13.

In the manner as above described, the insulating layer 10 can be formed on the core substrate 5. Note that the application of heat and pressure to the laminated body can be performed in a manner similar to that adopted in the process step (1).

(5) As shown in FIG. 5(c), the copper foil 16 is separated from the inorganic insulating layer 14 by means of etching using, for example, a liquid mixture of sulfuric acid and hydrogen peroxide solution, aqueous ferric chloride, or aqueous cupric chloride.

(6) As shown in FIGS. 6(a), 6(b), and 7(a), the via-conductor 12 is formed so as to pass through the insulating layer 10 in the thickness direction thereof, and the conductive layer 11 is formed on the insulating layer 10. Specifically, the formation is carried out as follows.

As a first step, as shown in FIGS. 6(a) and 6(b), laser light is applied to the insulating layer 10 by, for example, a YAG laser apparatus or a carbon dioxide laser apparatus to create the via-hole V running in a direction from the inorganic insulating layer 14 to the resin layer 13, and at this time at least part of the conductive layer 11 is exposed from the inside of the via-hole V. Next, as shown in FIG. 7(a), the via-conductor 12 is disposed inside the via-hole V by means of semi-additive processing, subtractive processing, fully-additive processing, or otherwise using, for example, the electroless plating technique or the electroplating technique, and also the conductive layer 11 is formed on the inorganic insulating layer 14 of the insulating layer 10.

It is noted that, in the method of manufacturing the wiring board 3 of this embodiment, in the process step (2), the individual first inorganic insulating particles 14a, as well as the first inorganic insulating particle 14a and the second inorganic insulating particle 14b, are connected together through the low-temperature heating process, wherefore such connections can be broken readily by the energy of laser light applied to the inorganic insulating layer 14. Accordingly, upon breaking of the connections, the first inorganic insulating particle 14a and the second inorganic insulating particle 14b are separated from the inorganic insulating layer 14, thereby forming the first penetrating portion V1. Then, when the application of laser light is stopped, at the inner wall of the first penetrating portion V1, part of the second inorganic insulating particles 14b is exposed therefrom away from the first inorganic insulating particle 14a at its area toward the first penetrating portion V1 while being kept connected to the first inorganic insulating particle 14a at its area opposite to the first penetrating portion V1. As a result, as shown in FIG. 6(b), the protrusion 14p including the second inorganic insulating particle 14b is formed at the inner wall of the first penetrating portion V1. The reason why the connections can be readily broken is because, presumably, the resin existing in the gap G is gasified by laser light application, and the resultant gas blows off the first inorganic insulating particles 14a, thereby severing the necked-down configuration.

Moreover, part of laser light passes through the second inorganic insulating particle 14b and thence reaches the opposite side of the layer from the radiation range, in consequence whereof there may result breaking of the connection between the second inorganic insulating particle 14b and the first inorganic insulating particle 14a at that side opposite to the radiation range. As a result, the second inorganic insulating particle 14b is separated from the first penetrating portion V1, thereby forming the recess D. Note that the second inorganic insulating particle 14b, when it has a spherical shape, is able to serve as a lens for condensing laser light at the side opposite to the radiation range, and this helps facilitate breaking of the connection between the second inorganic insulating particle 14b and the first inorganic insulating particle 14a.

As compared with the resin layer 13, the inorganic insulating layer 14 is more transmissive to laser light energy, wherefore laser light tends to diffuse greatly in the planar direction thereof. As a result, the first inclination angle A1 becomes larger than the second inclination angle A2 which is the angle of inclination of the inner wall of the second penetrating portion V2 relative to the penetrating direction.

In the case of utilizing a carbon dioxide laser which is long-wavelength laser light, since silicon oxide constituting the inorganic insulating layer 14 is characterized in that the energy of long-wavelength laser light is less absorbable and is thus transmitted readily therethrough when compared to the energy of short-wavelength laser light, it follows that the recess D can be created easily and the first inclination angle A1 is likely to increase.

When a carbon dioxide laser apparatus is adopted for use, the energy of laser light per pulse (shot) is adjusted to fall in the range of not less than 20 mJ (millijoule) and not more than 100 mJ for example, the pulse width of laser light is adjusted to fall in the range of not less than 10 μs (microsecond) and not more than 200 μs for example, and the number of shots of laser light is adjusted to fall in the range of not less than 1 and not more than 5 for example.

On the other hand, when a YAG laser apparatus is adopted for use, the energy of laser light per pulse (shot) is adjusted to fall in the range of not less than 20 pJ (microjoule) and not more than 100 pJ for example, the pulse width of laser light is adjusted to fall in the range of not less than 5 ns (nanosecond) and not more than 200 ns for example, and the number of shots of laser light is adjusted to fall in the range of not less than 3 and not more than 20 for example.

In the manner as above described, the via-hole V of the wiring board 3 of this embodiment can be formed. By the depositing of the via-conductor 12 on the inner wall of such a via-hole V, the protrusion 14p can be covered with the via-conductor 12, and the inside of the recess D is filled with part of the via-conductor 12.

(7) As shown in FIG. 7(b), by repeating the process steps (4) through (6), the wiring layer 6 is formed at each of the upper side and the lower side of the core substrate 5. Note that a repeat of this process step allows the wiring layer 6 to have a multilayer configuration.

In the manner thus far described, the wiring board 3 can be produced.

(Production of Mounting Structure)

(8) The mounting structure 1 shown in FIG. 1 can be produced by flip-chip mounting the electronic component 2 on the wiring board 3 via the bump 4.

While, in the above-described embodiment, the invention has been illustrated as a build-up multilayer board composed of a core substrate and wiring layers, the invention is applicable to other wiring board than the build-up multilayer board. For example, the invention is applicable to an interposer substrate and a single-layer board composed solely of a coreless substrate or a core substrate.

Moreover, while, in the above-described embodiment of the invention, the insulating layer composed of the inorganic insulating layer and the resin layer is used, an insulating layer composed solely of an inorganic insulating layer may be used instead.

Moreover, while, in the above-described embodiment of the invention, a stack of two insulating layers is provided in the wiring layer, there is no restriction on the number of the insulating layers.

Moreover, while, in the above-described embodiment of the invention, the insulating layer includes the inorganic insulating layer and the resin layer, and the conductive layer is formed on the inorganic insulating layer, the insulating layer may include, in addition to the aforementioned resin layer (first resin layer), an intermediate layer which is interposed between the insulating layer and the inorganic insulating layer. The intermediate layer is made of a resin material such for example as epoxy resin, bismaleimide triazine resin, cyanate resin, or polyimide resin, and, for example, in the process step (2) as described previously, instead of the copper foil, copper foil with resin having the intermediate layer is used in the formation.

Moreover, while, in the above-described embodiment of the invention, the base body and the resin layer are made of thermosetting resin, at least one of the base body and the resin layer, or both of them, may be made of thermoplastic resin. As the thermoplastic resin, for example, use can be made of fluorine resin, aromatic liquid crystalline polyester resin, polyether ketone resin, polyphenylene ether resin, or polyimide resin.

Moreover, while, in the above-described embodiment of the invention, the base body includes the resin portion, the base material, and the inorganic insulating filler, the base body may also include a metal plate which is covered with the resin portion.

Moreover, while, in the above-described embodiment of the invention, the inorganic insulating layer contains the first inorganic insulating particles and the second inorganic insulating particles, it is sufficient that the inorganic insulating layer is made to contain the first inorganic insulating particles and the second inorganic insulating particles, and therefore other inorganic insulating particles that differ in particle size from the first and second inorganic insulating particles may be contained in the inorganic insulating layer.

Moreover, while, in the above-described embodiment of the invention, the insulating layer includes the inorganic insulating layer which has, at the inner wall of the penetrating hole, the protrusion covered with the penetrating conductor, it is possible to adopt a design structure in which the base body includes an inorganic insulating layer, the inorganic insulating layer has a protrusion formed at the inner wall of a through hole corresponding to the penetrating hole, and the protrusion is covered with a through-hole conductor corresponding to the penetrating conductor. In this case, the inorganic insulating layer, the penetrating hole, and the penetrating conductor may be configured similarly to those of the preceding embodiment.

Moreover, while, in the above-described embodiment of the invention, the via-hole is so shaped that its diameter becomes smaller gradually from the inorganic insulating layer side toward the resin layer side, the via-hole may be designed to have a uniform diameter throughout its entirety in the direction from the inorganic insulating layer to the resin layer, or may be so designed that its diameter is reduced to a minimum at the interface between the inorganic insulating layer and the resin layer.

Moreover, while, in the above-described embodiment of the invention, the inorganic insulating sol is heated after the solvent is evaporated in the process step (2), the evaporation of the solvent and the application of heat to the inorganic insulating sol may be carried out at the same time.

Moreover, while, in the above-described embodiment of the invention, the uncured resin precursor sheet is placed on the inorganic insulating layer in the process step (4), an uncured resin precursor in liquid form may be applied to the inorganic insulating layer.

Moreover, while, in the above-described embodiment of the invention, the conductive layer is formed on the inorganic insulating layer in the process step (6) after the copper foil is separated from the inorganic insulating layer in the process step (5), the conductive layer may be formed by performing patterning on the copper foil without separating the copper foil from the inorganic insulating layer.

Moreover, while, in the above-described embodiment of the invention, the laminate sheet having the copper foil acting as a support member is used, it is sufficient that the laminate sheet is provided with a support member, and therefore, as the support member, other metallic foil than the copper foil may be used, or an electrically conducting material layer may be used instead of the metallic foil. In another alternative, an insulating sheet such as a resin sheet made of thermoplastic resin may be used as the support member.

EXAMPLES

Hereinafter, the invention will be particularized by way of practical examples, and it should be understood that the application of the invention is not limited to the practical examples as set forth hereunder, and that all changes and modifications without departing from the gist of the invention are intended to be embraced in the scope of the invention.

(Method of Evaluation)

An insulating layer composed of an inorganic insulating layer and a resin layer, which has a penetrating hole, was formed, and the insulating layer was cut along the thickness direction thereof, and the cross section was photographed by a field emission-type electron microscope (Model: JSM-7000F manufactured by JEOL Ltd.) for observation of the shape of the penetrating hole.

(Conditions to be Fulfilled in Forming Insulating Layer)

As a first step, there were prepared the first inorganic insulating particles and the second inorganic insulating particles made of silicon oxide. The first inorganic insulating particles were formed by causing the reaction of sodium silicate and water to precipitate silicon oxide in purification process. The resultant silicon oxide has been dispersed in a solvent prior to the mixing with the second inorganic insulating particles. On the other hand, the second inorganic insulating particles were formed by purifying a silicate compound, spraying the resultant solution containing chemically precipitated silicon oxide into flame, and applying heat at a temperature of not lower than 800° C. and not higher than 1500° C. while suppressing the formation of agglomeration. These inorganic insulating particles have been prepared while being maintained in an amorphous state.

Next, the first inorganic insulating particles and the second inorganic insulating particles have been compounded in predetermined amounts, and they were put in a plastic container and have been stirred and mixed evenly by a plastic ball.

In this way, an inorganic insulating sol was prepared. The inorganic insulating sol contains 46% by volume of the first and second inorganic insulating particles as solid matter, and contains 54% by volume of isopropanol as solvent. Moreover, the solid matter contains, as the first inorganic insulating particles, 40% by volume of particles having an average particle size of not less than 5 nm and not more than 105 nm, and contains, as the second inorganic insulating particles, 60% by volume of particles having an average particle size of not less than 0.9 μm and not more than 1.1 μm.

Then, the inorganic insulating sol was applied on to the intermediate layer of the copper foil with resin.

Next, the inorganic insulating sol has been heated at a temperature of 150° C., for 2 hours, and in an air atmosphere, and simultaneously the solvent has been evaporated, thereby forming a laminate sheet.

Then, the laminate sheet was placed on a resin precursor sheet containing uncured cyanate resin, with the inorganic insulating layer interposed between them, and the resultant laminated body has been subjected to heat and pressure for 1 hour, under a pressure of 3 MPa, and at a temperature of 180° C., whereupon a resin layer was bonded to the inorganic insulating layer.

Next, the copper foil was removed by means of etching using a ferric chloride solution.

Subsequently, a penetrating hole was created by means of laser light radiation using carbon dioxide laser equipment under the conditions where the energy of laser light per pulse (shot) is 40 mJ, the pulse width of laser light is 100 μs, and the number of shots of laser light is 3.

Example

Figure 8:
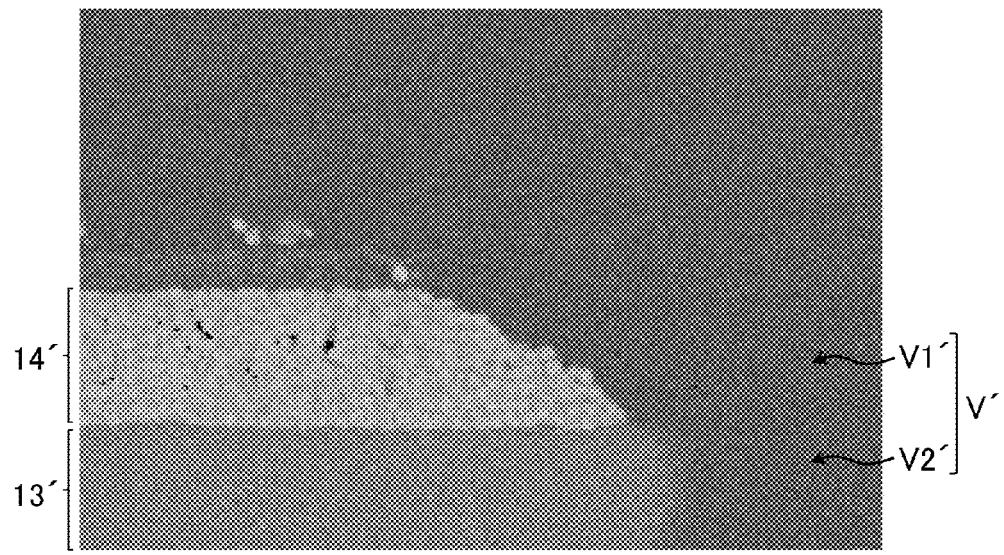
FIG. 8(a) is a photograph of part of a resin-sealed thickness-wise section of an insulating layer of practical example taken by a field emission-type electron microscope.
FIG. 8(b) is a photograph of part of a resin-free thickness-wise section of the insulating layer of practical example taken by a field emission-type electron microscope.
Figure 8:
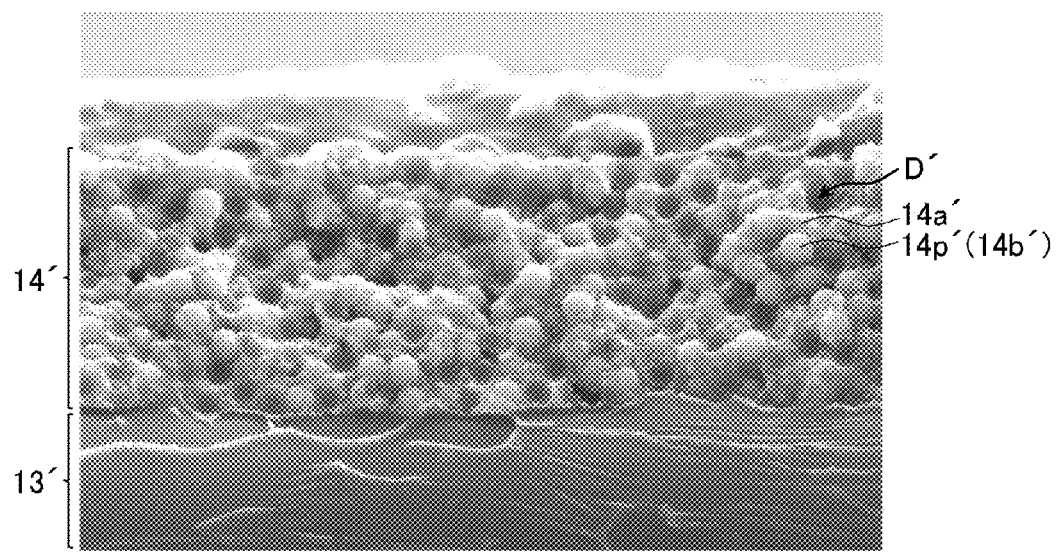

As shown in FIGS. 8(a) and 8(b), a protrusion 14p' including a second inorganic insulating particle 14b' was formed at the inner wall of a first penetrating portion V1' in an inorganic insulating layer 14'. Moreover, a recess D' was formed at the inner wall of the first penetrating portion V1' in the inorganic insulating layer 14' as the result of separation of the second inorganic insulating particle 14b'.

REFERENCE SIGNS LIST

1: Mounting structure
2: Electronic component
3: Wiring board
4: Bump
5: Core substrate
6: Wiring layer
7: Base body
8: Through hole conductor
9: Insulator
10: Insulating layer
11: Conductive layer
12: Via-conductor
13, 13': Resin layer
14, 14': Inorganic insulating layer
14a, 14a': First inorganic insulating particle
14b, 14b': Second inorganic insulating particle
14p, 14p': Protrusion
15: Laminate sheet
16: Copper foil
T: Through hole
V, V': Via-hole
V1, V1': First penetrating portion
V2, V2': Second penetrating portion
D, D': Recess

What is claimed is:

1. A wiring board, comprising:
an inorganic insulating layer provided with a penetrating hole; and
a penetrating conductor disposed inside the penetrating hole,
wherein the inorganic insulating layer includes first inorganic insulating particles connected to each other and second inorganic insulating particles that are larger in particle size than the first inorganic insulating particles and are connected to each other via the first inorganic insulating particles, the inorganic insulating layer having, at an inner wall of the penetrating hole, a protrusion including at least part of the second inorganic insulating particle, and
the protrusion is covered with the penetrating conductor.

2. The wiring board according to claim 1, further comprising:
a resin layer disposed on the inorganic insulating layer,
wherein the penetrating hole passes through both the inorganic insulating layer and the resin layer, and includes a first penetrating portion located in the inorganic insulating layer and a second penetrating portion located in the resin layer, and
wherein a ten-point average roughness of the inner wall of the first penetrating portion is greater than a ten-point average roughness of the inner wall of the second penetrating portion.

3. The wiring board according to claim 1, further comprising:
a resin layer disposed on the inorganic insulating layer,
wherein the penetrating hole passes through both the inorganic insulating layer and the resin layer, is so shaped that its diameter becomes smaller from a inorganic insulating layer side toward a resin layer side, and includes a first penetrating portion located in the inorganic insulating layer and a second penetrating portion located in the resin layer, and wherein an inclination angle of the inner wall of the first penetrating portion relative to a penetrating direction of the penetrating hole is greater than an inclination angle of the inner wall of the second penetrating portion relative to the penetrating direction.

4. The wiring board according to claim 1,
wherein a ten-point average roughness of the inner wall of the penetrating hole of the inorganic insulating layer is greater than a ten-point average roughness of a main surface of the inorganic insulating layer.

5. The wiring board according to claim 1,
wherein the inorganic insulating layer has, at the inner wall of the penetrating hole, a recess which is created as a result of separation of the second inorganic insulating particle, at least part of which is buried in the inorganic insulating layer, from the inorganic insulating layer, and
wherein the recess is filled with part of the penetrating conductor.

6. The wiring board according to claim 1,
wherein the second inorganic insulating particle has a spherical shape.

7. The wiring board according to claim 1,
wherein the first inorganic insulating particles have a particle size of not less than 3 nm and not more than 110 nm, and
wherein the second inorganic insulating particles have a particle size of not less than 0.5 μm and not more than 5 μm.

8. The wiring board according to claim 1,
wherein the inorganic insulating layer is made of silicon oxide, and
wherein the penetrating conductor is made of copper.

9. A mounting structure, comprising:
the wiring board according to claim 1; and
an electronic component mounted on the wiring board and electrically connected to the penetrating conductor.

* * * * *